(12) United States Patent
Heist et al.

(10) Patent No.: US 6,243,406 B1
(45) Date of Patent: Jun. 5, 2001

(54) GAS PERFORMANCE CONTROL SYSTEM FOR GAS DISCHARGE LASERS

(76) Inventors: Peter Heist, Closewlizer Str. 2a, D-07743 Jena; Matthias Kramer, Thiaetrasse 3a, D-37077 Göttingen; Jürgen Kleinschmidt, Rosa-Luxemburg-Strasse 18, D-06667 Weissanfels, all of (DE); Sergei Govorkov, 6315 LaCosta Dr., Apt. M, Boca Raton, FL (US) 33433

(*) Notice: Subject to any disclaimer, the term of this patent is extended or adjusted under 35 U.S.C. 154(b) by 0 days.

(21) Appl. No.: 09/418,052

(22) Filed: Oct. 14, 1999

Related U.S. Application Data

(60) Provisional application No. 60/123,928, filed on Mar. 12, 1999.

(51) Int. Cl.$^7$ .................................................. H01S 3/22
(52) U.S. Cl. ............................................ 372/59; 372/57
(58) Field of Search .................................... 372/59, 27, 98, 372/25, 57, 60

(56) References Cited

U.S. PATENT DOCUMENTS

| | | | |
|---|---|---|---|
| 3,899,750 | 8/1975 | Houchuli ................... | 331/94.5 G |
| 4,429,392 | 1/1984 | Yoshida et al. ............ | 372/9 |
| 4,534,034 | 8/1985 | Hohla et al. ............... | 372/59 |
| 4,740,982 | 4/1988 | Hakuta et al. ............. | 372/59 |
| 4,977,573 | 12/1990 | Bittenson et al. ........ | 372/81 |
| 5,090,020 | 2/1992 | Bedwell .................... | 372/59 |
| 5,097,291 | 3/1992 | Suzuki ...................... | 355/69 |
| 5,142,543 | 8/1992 | Wakabayashi et al. ... | 372/32 |
| 5,149,659 | 9/1992 | Hakuta et al. ............. | 436/55 |
| 5,377,215 | 12/1994 | Das et al. .................. | 372/57 |
| 5,396,514 | 3/1995 | Voss ......................... | 372/57 |
| 5,440,578 | 8/1995 | Sandstrom ................ | 372/59 |

(List continued on next page.)

FOREIGN PATENT DOCUMENTS

| | | | |
|---|---|---|---|
| 3212928A | 10/1983 | (DE) | ................ H01S/3/02 |
| 29713755 U1 | 8/1997 | (DE) | ................ H01S/3/03 |
| 10341050 | 12/1998 | (JP) | ............... H01S/3/036 |

OTHER PUBLICATIONS

R.S. Taylor, "Preionization and Discharge Stability Study of Long Optical Pulse Duration UV–Preionized XeCl Lasers", Applied Physics B, vol. B 41, No. 1, Sep. 1986.

G.M. Jursich, et al., "Gas contaminant effects in discharge–excited KrF lasers," Applied Optics, vol. 31, Apr. 1992.

Joseph H. Eberly, Superradiance Revisited, American Journal of Physics, vol. 40/10, Oct. 1972.

V.F. Weisskopf et al, Z. Physik, 63, 54, 1930.

Lambda Physik Highlights, Apr. 1993.

*Primary Examiner*—Leon Scott, Jr.
(74) *Attorney, Agent, or Firm*—Sierra Patent Group, Ltd.; Andrew V. Smith

(57) ABSTRACT

A gas mixture of a gas discharge laser such as an excimer or molecular fluorine laser is stabilized. The gas mixture of the laser includes a constituent halogen containing molecular species such as $F_2$ or HCl which is subject to depletion from an initial optimum concentration. When the gas mixture is energized by a pulsed discharge circuit, the amplified spontaneous emission (ASE) signal is monitored. The status of the gas mixture is determined based on the monitored ASE signal. Stimulated emission is preferably filtered or blocked for more precise ASE signal monitoring. The gas mixture is preferably replenished using small halogen injections, total pressure adjustments and mini and partial gas replacements based on the evolving gas mixture status determined from the monitored ASE signal. Another parameter may be monitored such as the driving voltage to indicate the status of another system specification such as alignment or degradation of resonator optics, synchronization of optical components, contamination within the resonator or purge conditions for a $F_2$-laser enclosure.

43 Claims, 6 Drawing Sheets

U.S. PATENT DOCUMENTS

| | | | |
|---|---|---|---|
| 5,450,436 | 9/1995 | Mizoguchi et al. | 372/59 |
| 5,586,134 | 12/1996 | Das et al. | 372/38 |
| 5,642,374 | 6/1997 | Wakabayashi et al. | 372/57 |
| 5,646,954 | 7/1997 | Das et al. | 372/55 |
| 5,754,579 | 5/1998 | Mizoguchi et al. | 372/58 |
| 5,887,014 | 3/1999 | Das | 372/59 |
| 6,005,879 * | 12/1999 | Sandstrom et al. | 372/25 |
| 6,014,398 * | 1/2000 | Hofmann et al. | 372/60 |
| 6,130,904 * | 10/2000 | Ishihara et al. | 372/59 |
| 6,151,349 * | 11/2000 | Gong et al. | 372/59 |

* cited by examiner

GAS PERFORMANCE CONTROL SYSTEM FOR GAS DISCHARGE LASERS

PRIORITY

This application claims the benefit of priority to U.S. Provisional patent application No. 60/123,928, filed Mar. 12, 1999.

BACKGROUND OF THE INVENTION

1. Feild of the Invention

The present invention relates to a method and apparatus for stabilizing output beam parameters of a gas discharge laser. More particularly, the present invention relates to maintaining an optimal gas mixture composition by performing gas replenishment based on a monitored amplified spontaneous emission (ASE) signal which varies with the gas mixture status.

2. Discussion of the Related Art

Pulsed gas discharge lasers such as excimer and molecular lasers emitting in the deep ultraviolet (DUV) or vacuum ultraviolet (VUV) have become very important for industrial applications such as photolithography. Such lasers generally include a discharge chamber containing two or more gases such as a halogen and one or two rare gases. KrF (248 nm), ArF (193 nm), XeF (350 nm), KrCl (222 nm), XeCl (308 nm), and $F_2$ (157 nm) lasers are examples.

The efficiencies of excitation of the gas mixtures and various parameters of the output beams of these lasers vary sensitively with the compositions of their gas mixtures. An optimal gas mixture composition for a KrF laser has preferred gas mixture component ratios around ~0.1% $F_2$/~1% Kr/~98.9% Ne. An $F_2$ laser has a preferred gas component ratio around ~0.1% $F_2$/~99.9% Ne (or He) (see U.S. patent application Ser. No. 09/317,526, which is hereby incorporated by reference). Any deviation from these optimum gas compositions or those for other excimer or molecular lasers would typically result in instabilities or reductions from optimal of one or more output beam parameters such as beam energy, energy stability, temporal pulse width, temporal and spatial coherence, bandwidth, and long and short axial beam profiles and divergences.

Especially important in this regard is the concentration (or partial pressure) of the halogen containing molecules, e.g., $F_2$ or HCl, in the gas mixture. The depletion of the rare gases, e.g., Kr and Ne for a KrF laser, is low in comparison to that for the $F_2$, although these rare gases are also replenished at longer intervals.

In industrial applications, it is advantageous to have an excimer or molecular laser capable of operating continuously for long periods of time, i.e., having minimal downtime. It is desired to have an excimer or molecular laser capable of running non-stop year round, or at least having a minimal number and duration of down time periods for scheduled maintenance, while maintaining constant output beam parameters. Uptimes of, e.g., greater than 98% require precise control and stabilization of output beam parameters, which in turn require precise control of the composition of the gas mixture.

Unfortunately, halogen depletion due to electrode erosion occurs in excimer and molecular lasers due to the aggressive nature of the fluorine or chlorine in the gas mixture. The halogen gas is highly reactive and its concentration in the gas mixture decreases as it reacts, leaving traces of contaminants. The halogen gas reacts with materials of the discharge chamber or tube. Moreover, the reactions take place and the gas mixture degrades whether the laser is operating (discharging) or not. The static gas lifetime is about one week for a typical KrF-laser. For a static KrF laser gas mixture, i.e., with no discharge running, increases in the concentrations of HF, $O_2$, $CO_2$ and $SiF_4$ have been observed (see Jurisch et al., below). During operation of a KrF-excimer laser, such contaminants as HF, $CF_4$, $COF_2$, $SiF_4$ have been observed to increase in concentration rapidly (see G. M. Jursich et al., *Gas Contaminant Effects in Discharge-Excited KrF Lasers*, Applied Optics, Vol. 31, No. 12, pp. 1975–1981 (Apr. 20, 1992)).

One way to effectively reduce this gas degradation is by reducing or eliminating contamination sources within the laser discharge chamber. With this in mind, an all metal, ceramic laser tube has been disclosed (see D. Basting et al., *Laserrohr für halogenhaltige Gasentladungslaser*" G 295 20 280.1, Jan. 25, 1995/Apr. 18, 1996 (disclosing the Lambda Physik LP Novatube); and German Gebrauchsmuster DE 297 13 755.7 of Lambda Physik (disclosing an excimer or molecular laser having a window mount with a metal ceiling), each of which is hereby incorporated by reference). Gas purification systems, such as cryogenic gas filters (see U.S. Pat. No. 4,534,034) or electrostatic particle filters (see U.S. Pat. No. 5,586,134) are also being used to extend KrF laser gas lifetimes to 100 million shots before a new fill is advisable. Notwithstanding using improved laser tubes and cryogenic purification systems, the most important techniques for stabilizing gas mixtures include gas replenishment procedures, whereby halogen injections (HI), rare gas injections, partial gas replacements (PGR) and total pressure adjustments are performed. The specific gas replenishment amounts and intervals are determined based on this evolution of the composition of the gas mixture, which is most prominently determined by depletion of the halogen species. U.S. provisional patent application no. 60/1 24,785 discloses the preferred gas replenishment procedure of the present invention and is hereby incorporated by reference. The '785 provisional application discloses to use several small gas actions such as micro-halogen injections ($\mu$Hl) and mini-gas replacements ($MGR_i$) which are gas replacement procedures performed at multiple carefully selected intervals and amounts, in addition to total pressure adjustments, partial gas replacements (PGR) and new fills.

It is not easy, however, to directly measure the halogen concentration within the laser tube for making rapid online adjustments (see U.S. Pat. No. 5,149,659 (disclosing monitoring chemical reactions in the gas mixture) and Japanese Patent No. JP 10341050 (disclosing a method wherein optical detection of a halogen specific emission is performed)). Therefore, advantageous methods applicable to industrial laser systems include using a known relationship between $F_2$ or HCl concentration and a laser parameter. In such a method, precise values of the parameter would be directly measured, and the $F_2$ or HCl concentration would be calculated from those values. In this way, the $F_2$ concentration may be indirectly monitored.

Previously described methods for laser gas characterization include measuring the spectral width of the laser emission (see U.S. Pat. No. 5,450,436 to Mizoguchi et al.), measuring the spatial beam profile of the laser emission (see U.S. Pat. No. 5,642,374 to Wakabayashi et al.) and measuring other characteristics of the output beam such as bandwidth, coherence, driving voltage or energy stability wherein a rough estimation of the status of the gas mixture may be made (see U.S. Pat. No. 5,440,578 to Sandstrorrr, U.S. Pat. No. 5,887,014 to Das and U.S. patent application Ser. No. 09/167,653 to Vogler et al., filed Oct. 5, 1998).

In the Vogler Application (09/167,653, which is hereby incorporated by reference), a data set of an output parameter such as pulse energy and input parameter such as driving voltage is measured and compared to a stored "master" data set corresponding to an optimal gas composition such as is present in the discharge chamber after a new fill. From a comparison of the data values and/or the slopes of curves generated from the data sets, a present gas mixture status and appropriate gas replenishment procedures, if any, are determined and undertaken to reoptimize the gas mixture. It is desired to improve upon all of the above-described techniques by performing gas control based on the monitored values of a parameter that varies with a known correspondence with the halogen content in the gas mixture. Moreover, the desired parameter would not be greatly influenced by other laser system and output beam parameters, such as resonator alignment, repetition rate, tuning accuracy, thermal conditions, aging of the laser tube and degradation of optics.

Another technique uses a mass spectrometer for precision analysis of the gas mixture composition (see U.S. Pat. No. 5,090,020 to Bedwell). However, a mass spec is an undesirably hefty and costly piece of equipment to incorporate into a continuously operating excimer or molecular laser system such as a KrF, ArF or $F_2$ laser system which are typical light sources used in microlithographic stepper or scanner systems. Yet another technique measures fluorine concentration in a gas mixture via monitoring chemical reactions (see U.S. Pat. No. 5,149,659 to Hakuta et al.), but this method is not suitable for use with a rapid online correction procedure. It is desired to have a precise technique for monitoring gas mixture status which is easily adaptable with current excimer or molecular laser systems and provides rapid online information.

In typical gas discharge lasers such as excimer or molecular fluorine lasers, a constant laser pulse energy is maintained in short-term notwithstanding the degradation of the gas mixture by regulating the driving voltage applied to the discharge. As mentioned above, long term regulation is achieved by gas replenishment actions such as halogen injections (HI), total pressure adjustments and partial gas replacement (PGR). The smoothed long-term stabilization of the gas mixture composition uses a regulation loop where input laser system parameter data are processed by a computer (see U.S. patent application Ser. No. 09/167,653 to Vogler et al., above).

In these typical laser systems, an energy detector is used to monitor the energy of the output laser beam. The computer receives the pulse energy data from the energy detector as well as driving voltage information from the electrical pulse power module. This information is not selective enough since the energy monitor signal is influenced not only by the gas but also by resonator optics degradation or misalignment. The typical operation mode is the so-called energy-constant mode where the pulse energy is kept constant by adjusting the driving high voltage of the electrical pulse power module. In this way one gets constant values from the energy monitor. A change of the laser status which again can be caused by gas aging as well as by the status of the laser resonator leads to a change of the driving voltage. It is desired to operate the laser at an approximately constant driving voltage level. To achieve this an appropriate smoothed gas regulation procedure is necessary, In the example of an excimer laser usually the halogen gas component ($F_2$ in KrF lasers) is depleted whereas the other gases (nobel gases Kr and Ne in KrF lasers) are usually not depleted. Therefore $\mu$/HI's or other suitable smoothed gas actions are applied.

SUMMARY OF THE INVENTION

It is an object of the invention to provide an excimer or molecular laser system, wherein the gas mixture status may be precisely and periodically determined.

It is another object of the invention to provide an excimer or molecular laser system capable of running continuously while stabilizing output beam parameters using gas replenishment techniques based on a running determination of the gas mixture status.

The present invention meets these objects by providing a gas discharge laser system such as an excimer or molecular laser including a discharge chamber containing a gas mixture, a pair of electrodes connected to a power supply circuit for energizing the gas mixture, and a resonator for generating a laser beam. The system also includes an ASE detector or means for monitoring the amplified spontaneous emission (ASE) signal of the laser to determine gas mixture status. The monitoring means may be an ASE detector such as is described herein.

The gas mixture of the laser includes a constituent halogen containing species such as $F_2$ or HCl which is subject to depletion from an initial optimum concentration. The status of the gas mixture is determined based on the ASE signal which is monitored when the gas mixture is energized by the power supply circuit. Any stimulated emission is preferably filtered or blocked for more precise ASE signal monitoring. The gas mixture is preferably replenished using small halogen injections ($\mu$HI) and mini and/or partial gas replacements (MGR/PGR) based on the evolving gas mixture status determined from the monitored ASE signal.

BRIEF DESCRIPTION OF THE DRAWINGS

FIG. 6b is a graph of photon density versus time of the ASE contribution to the laser pulse of FIG. 6a.

FIG. 7b is a graph of photon density versus time of the ASE contribution to the laser pulse of FIG. 7a.

DETAILED DESCRIPTION OF THE PREFERRED EMBODIMENT

The present invention provides a signal which is directly related to the status of the gas mixture of a gas discharge laser. An advantage of the present invention is that the input signal of the processor controlled regulation loop is the amplified spontaneous emission signal (ASE) of the laser (for a general discussion of spontaneous emission, please see, e.g., V. F. Weisskopf and E. Wigner, Z. Phys. 63, 54 (1930); R. H. Dicke and J. P. Wittke, *Introduction to Quantum Mechanics*, Addison-Wesley (1960); and/or J. H. Eberly, *American J. Phys.*, 40, 1374 (1972)).

Figure 1:
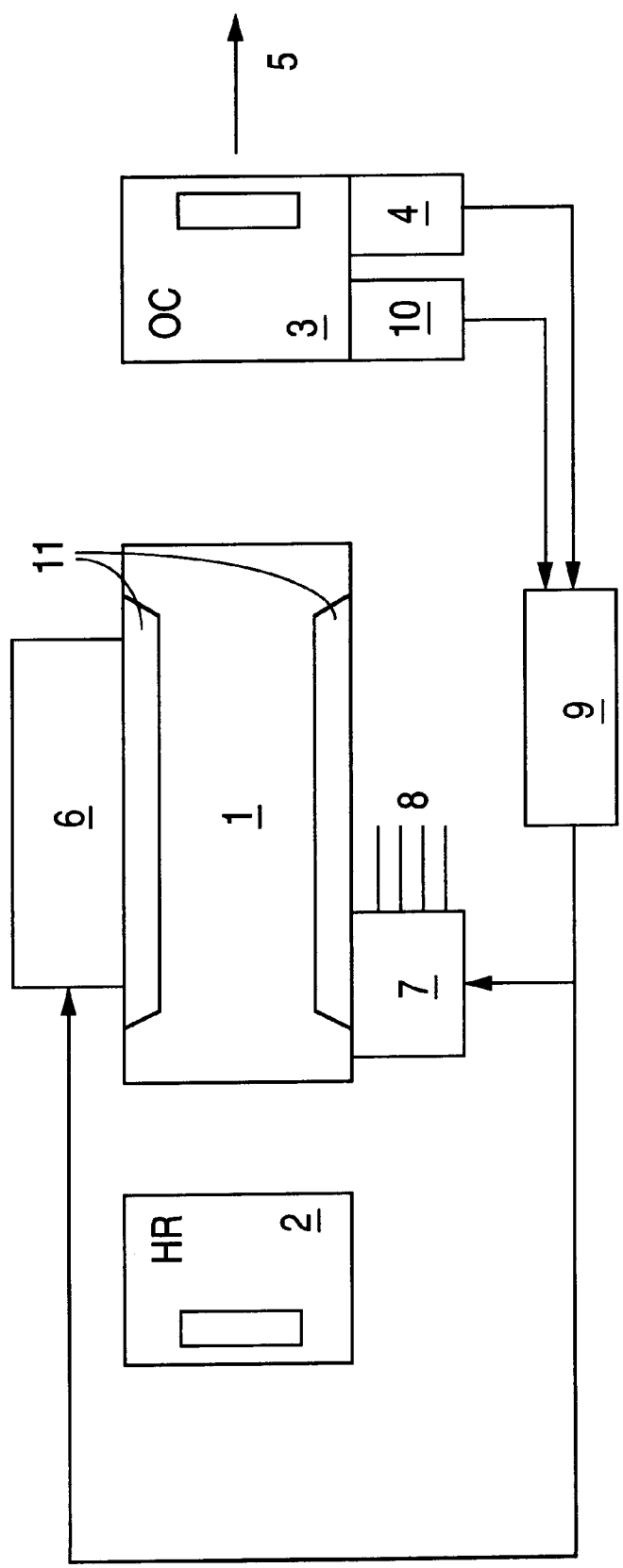
FIG. 1 shows a schematic block diagram of a gas discharge laser system having a regulation loop including an ASE detector.

FIG. 1 shows a schematic block diagram of a gas discharge laser system such as an excimer or molecular laser (e.g., $F_2$, KrF, ArF, XeCl, XeF, KrCl) in accord with a preferred embodiment of the present invention. The laser system includes a laser tube or discharge chamber 1 containing a gas mixture, a pair of main electrodes 11 connected to an electrical pulse power and discharge module 6 controlled by a processor 9, and a fan and cooling unit. The gas mixture typically comprises a halogen containing molecular species (e.g., $F_2$ or HCl), an active rare gas (e.g., Kr, Ar or Xe) and a buffer gas (e.g., Ne or He), or in the case of the $F_2$ laser, $F_2$ and a buffer gas (e.g., Ne or He). The electrodes 11 are preferably configured of a specialized shape and material(s), depending on the laser being used, such as are disclosed in U.S. Pat. Nos. 4,860,300, 5,347,532 or 5,729,565 or German Patent No. DE 44 01 892, each of which is hereby incorporated by references into the present application.

The gas mixture is filled into the discharge chamber during new fills. Halogen and rare gas injections, total pressure adjustments and gas replacement procedures are performed using a gas control box 7 including a vacuum pump, a valve network and one or more gas compartments. The gas control box receives gas via gas lines 8 connected to gas containers, tanks, canisters and/or bottles. The gas control box is controlled by the processor 9.

A resonator surrounds the discharge chamber 1 and preferably comprises a rear optics module 2 and a front optics module 3. The rear optics module 2 preferably includes a highly reflective optic which may be a mirror, or a mirror with a dispersive prism in front of it, or a dispersive reflection grating usually with one or more beam expanding prism(s) in front of it. With a dispersive element, the natural linewidth of the laser is reduced or a single line of a discrete spectrum is selected. The wavelength of the output beam 5 can be tuned by an adjustable orientation of the mirror or the grating. The rear optics module 2 may be configured to permit a small amount of radiation to exit so it can be used with certain beam parameter monitoring activities not otherwise discussed below, such as wavelength calibration as is described in U.S. patent applications Ser. No. 09/136,275 or 09/271,020. In particular, a line narrowing module would be used for a KrF or ArF laser preferably comprising multiple prisms or a grating and one or more prisms, and line selection optics would be used for a $F_2$ laser (e.g., besides the dispersive element mentioned above, an etalon, a birefringent plate and/or one or more prisms such as are described in U.S. patent applications Ser. No. 09/317,527 and 09/317,695 which are hereby incorporated by reference). Additional optical elements may be included with the rear optics module for beam steering.

The front optics module 3 preferably includes an outcoupler, and may include additional optics for beam steering, splitting or forming such as mirror(s), beam splitter (s), prism(s), etalon(s) and/or grating(s). The output beam 5 of the laser system preferably exits the resonator via the outcoupler of the front optics module 3.

An energy monitor 4 is shown in FIG. 1 near the front optics module 3 for detecting a signal proportional to the pulse energy of the output beam 5. This energy information is sent to the processor 9 from the energy monitor 4, typically over a serial interface.

An ASE signal detector 10 is shown near the front optics module 3 for detecting a signal proportional to the ASE of the laser. This ASE signal information is also sent to the processor 9 from the ASE detector 10.

The ASE signal can be measured by any of a variety of ASE detection devices 10. For example, a photodiode detector configured to detect a peak intensity of the ASE signal or the ASE signal integrated over time. For very short wavelengths such as are generated by the $F_2$-Laser (157 nm), a specialized VUV sensitive detector is preferred. Such a preferred detector is disclosed at United States provisional patent application no. 60/122,145, which is hereby incorporated by reference into the present application. A detector such as is described in U.S. patent application Ser. No. 09/172,805, which is also hereby incorporated by reference, may also be used.

The preferred DUV or VUV sensitive detector is a diamond photodetector which has nearly zero sensitivity above around 225 nm and has a good spectral response below 200 nm. The preferred detector is mounted in a housing preferably including a scattering plate for attenuation preferably comprising $CaF_2$ and a metal mesh for preventing EMI disturbances. The preferred detector may alternatively or in combination with being substantially the detector disclosed in the '145 provisional application, include a UV-to-visible conversion plate such as is disclosed in the '805 application.

It is desirable to detect the ASE signal substantially separate from the stimulated emission as it is otherwise difficult to resolve the ASE signal out of the entire laser pulse signal. This substantial separation of the ASE signal from the entire laser pulse signal is achieved in the present invention because it is recognized in the present invention that ASE and stimulated emission signals have some different properties. First, the ASE signal exhibits a greater divergence than the signal including the stimulated emission signal due to the collimating effects of the resonator and the nature of stimulated emission. Second, the ASE signal is non-polarized whereas the stimulated emission signal is usually polarized in one direction due to polarizing optical elements of the resonator (e.g., prisms, polarizing beamsplitters or windows oriented at Brewster's angle). Third, the ASE signal temporally arises before the stimulated emission signal or at the leading edge of the laser pulse. Fourth, the laser emission signal is largely dependent on photons appearing in the discharge chamber after reflecting from one or both resonator reflectors 2, 3 one or more times, whereas the ASE is independent of how many photons enter the discharge chamber after being reflected from a resonator reflector 2, 3. These four properties can each be used for discrimination that will be referred to as polarizational, angular, temporal and mechanical discrimination.

Figure 2A:
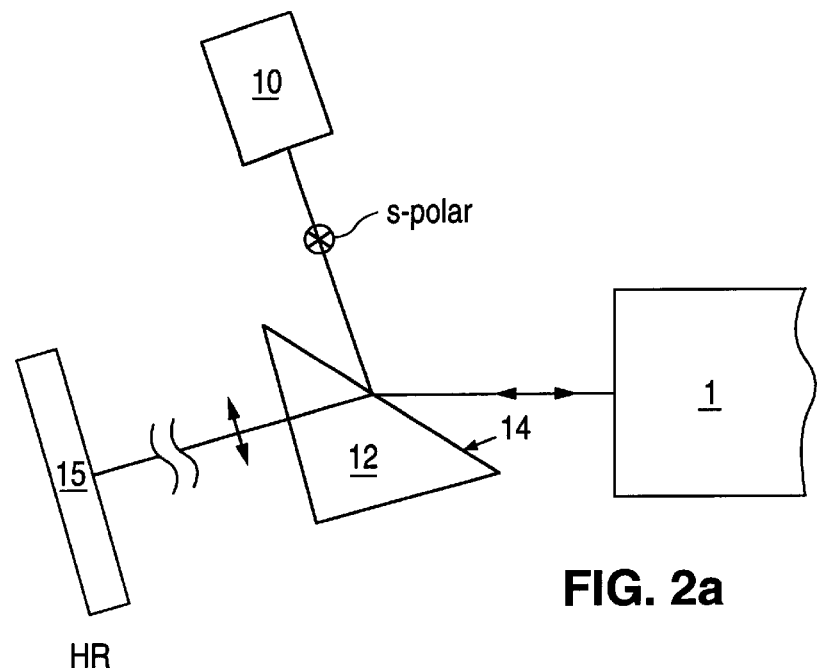
FIG. 2a shows a first embodiment of an ASE detector in accord with the present invention which uses polarizational ASE detection.

FIG. 2a shows a first apparatus for use with ASE signal detection in accord with the present invention which uses discrimination of p-polarized laser light. A prism 12 of the rear optics module 2 has a front surface 14 which may be oriented at the Brewster angle along the optical path of the resonating beam. As such, the front surface 14 transmits substantially all P-polarized light incident on it. Thus, substantially only s-polarized incident light is reflected from the front surface 14 of the prism 12. Referring to FIG. 2a, substantially all of the p-polarized light and a fraction of the s-polarized light incident at the front surface 14 of the prism 12 continue along the optical path of the resonator to the highly reflective optic 15. In this case, the stimulated emission signal is substantially p-polarized and as such it is not reflected from the front surface 12 to the detector 10. Instead of using the Brewster angle, a dielectric coating or coatings which reflect only s-polarized light may be used. Also, instead of using the front surface 12 of the prism 14, another optical component such as a polarizing beam splitter which can be an uncoated plate oriented near the Brewster angle or more effectively a plate with a special coating that reflects nearly all incident s-polarized light, or an optical Brewster window of the discharge chamber may be used.

Figure 2B:
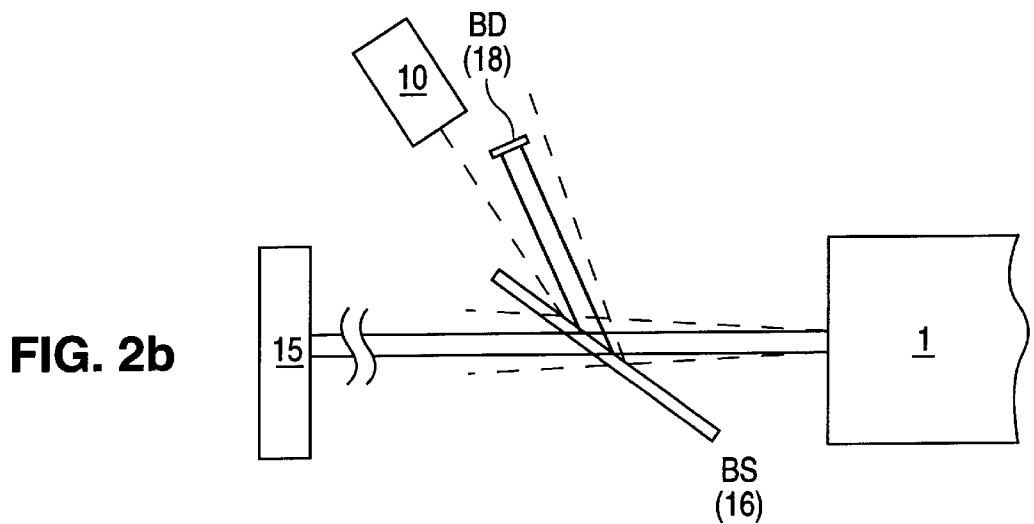
FIG. 2b shows a second embodiment of an ASE detector in accord with the present invention which uses angular ASE detection including a central axis beam dump.

FIG. 2b shows a second apparatus for use with ASE signal detection in accord with the present invention. The second apparatus permits a discrimination technique taking advantage of the fact that the ASE has a greater divergence than the stimulated emission. A beam splitter 16 is shown in FIG. 2b reflecting out a portion of the main beam. As above, another optical component may be used for this purpose. In addition, a small portion of the main beam may be used which is permitted to exit the highly reflective optic 15. A central beam dump 18 is positioned substantially at the center of the separated beam portion. The bearr dump 18 blocks the center portion of the separated beam which contains the substantial portion of the stimulated emission signal in the separated beam. Some of the ASE signal portion of the separated beam passes around the beam dump 18 owing to its greater divergence. The detector 10 is positioned to detect this portion of the ASE signal which passes around the beam dump 18. In this regard, the detector 10 may be as shown in FIG. 2b, or the detector 10 may be larger than the beam stop 18 wherein the beam stop 18 is in the middle of it such that the detector 10 may capture light on more than one side of the dump 18, or a lens may be positioned after the beam stop 18 to focus light from all sides of the beam stop onto the detector 10. The dimension of the beam dump 18 is selected to just block the substantial portion of the stimulated emission signal of the separated beam to allow a maximum amount of ASE signal to pass around the beam dump 18.

A third apparatus for use with ASE detection in accord with the present invention includes electronics for temporally discriminating all but the leading edge of a detected portion of the main beam. ASE photons are generated by the discharge and not by stimulated emission facilitated by the presence of other photons. Thus, the ASE photons are the first ones to appear from the discharge chamber after the discharge. As such, the leading edge which substantially contains the ASE signal portion of the detected portion is separated from the entire signal which may then be analyzed in accord with the present invention.

Figure 2C:
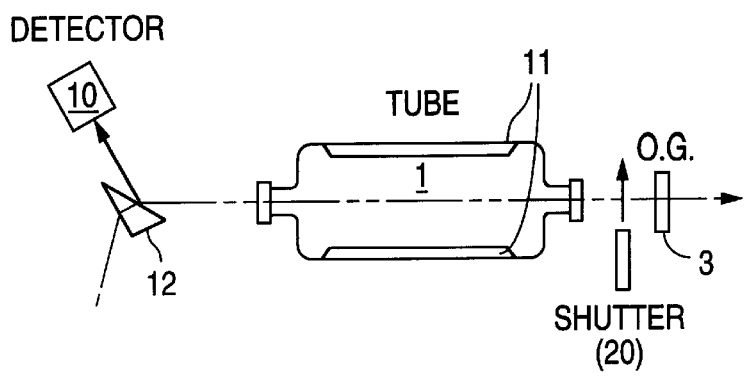
FIG. 2c shows a fourth embodiment of an ASE detector in accord with the present invention which uses a shutter for blocking the resonator.

A fourth apparatus for use with ASE detection in accord with the present invention is illustrated at FIG. 2c and includes an excimer or molecular laser having shutter 20 for blocking the resonator. The resonator may be blocked, e.g., using a shutter or other mechanism placed inside the resonator between the discharge chamber 1 and one of the resonator reflectors 2, 3 such as the outcoupling mirror 3 and/or a highly reflective mirror 2. A large portion of the stimulated emission signal, i.e., that arising from photons reflecting back into the discharge chamber from the resonator reflectors 2 or 3 that are blocked by the shutter(s) 20, and otherwise appearing at the detector 10, is thus avoided, while practically none of the ASE signal is hampered. Only one of the resonator reflectors need be blocked to avoid stimulated emission signals at the detector 10. The shutter 20 can be closed quickly and an ASE measurement taken while, e.g., the stepper is moving to a different place on a wafer or to a different wafer, such that the ASE signal measurement may be performed online even though the resonator is briefly blocked in the fourth embodiment.

It is recognized in the present invention that the ASE signal measured by the detector 10, and preferably discriminated from the stimulated emission signal using one of the techniques described above, is strongly correlated to the status of the gas mixture. The ASE signal is a direct measure of population inversion density of the gas mixture. The population inversion density is proportional to the small signal gain $g_o$. To a good approximation, the ASE signal intensity varies depending on the small signal gain $g_o$ according to the following equation:

$$\text{ASE signal} \sim \exp[g_o \cdot L] \qquad (1)$$

In equation (1), L is the length of the gain medium. This is particularly clear from observations using an arrangement including an inverted gain medium without a feedback mechanism such as a resonator. Such an arrangement can be realized according to the description above of the fourth apparatus using a laser system wherein the beam path is blocked somewhere within the resonator. For example, a shutter may be introduced between the discharge chamber and one of the resonator reflectors such as the outcoupling mirror or the highly reflective mirror. In such an arrangement without a feedback mechanism, where laser oscillation is blocked, the ASE signal generally depends on the number of active gas molecules (i.e., for a KrF laser the number of $F_2$ and Kr molecules, for an ArF laser the number of $F_2$ and Ar molecules, and for a $F_2$ laser the number of $F_2$ molecules), and the electrical power brought into the discharge which is a function of the driving voltage. Of course, the specific dependence is more complex and based on the discharge quality and rate equations.

Figure 3:
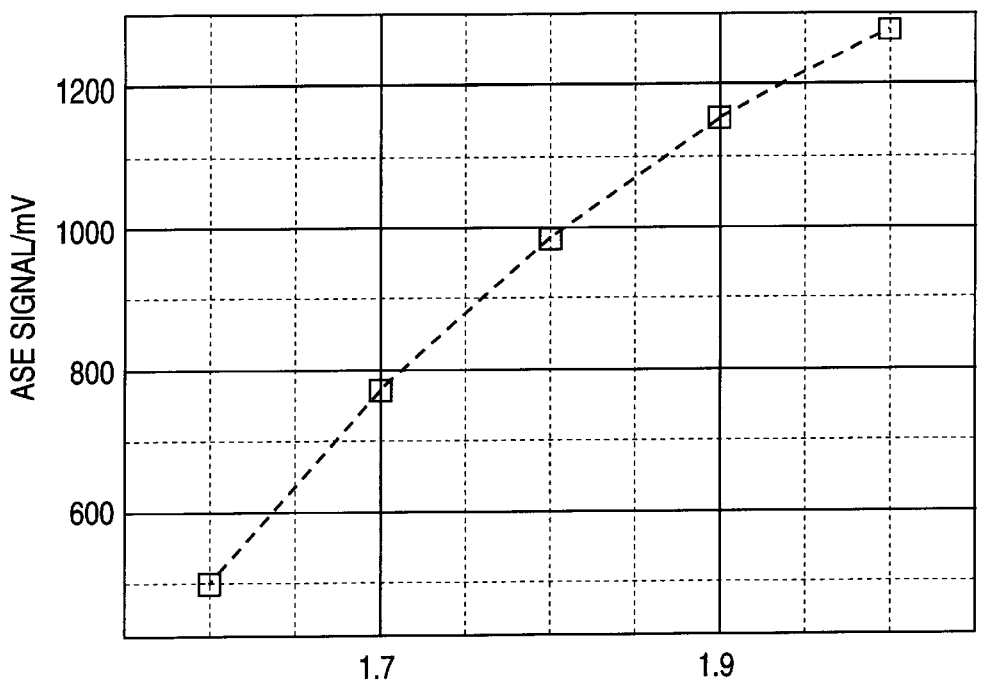
FIG. 3 is a graph of ASE signal versus driving voltage measured under constant gas mixture conditions.

FIG. 3 shows a measured ASE signal for a laser with a blocked resonator versus the driving discharge voltage at constant gas mixture conditions. In the experiment shown at FIG. 3, the driving voltage began at 1.5 kV and was incremented in steps of 0.2 kV from 1.5 kV to 2.1 kV. The ASE signal increased with each increment of driving voltage from about 500 mV at 1.5 kV to about 1275 mV at 2.1 kV.

Figure 4:
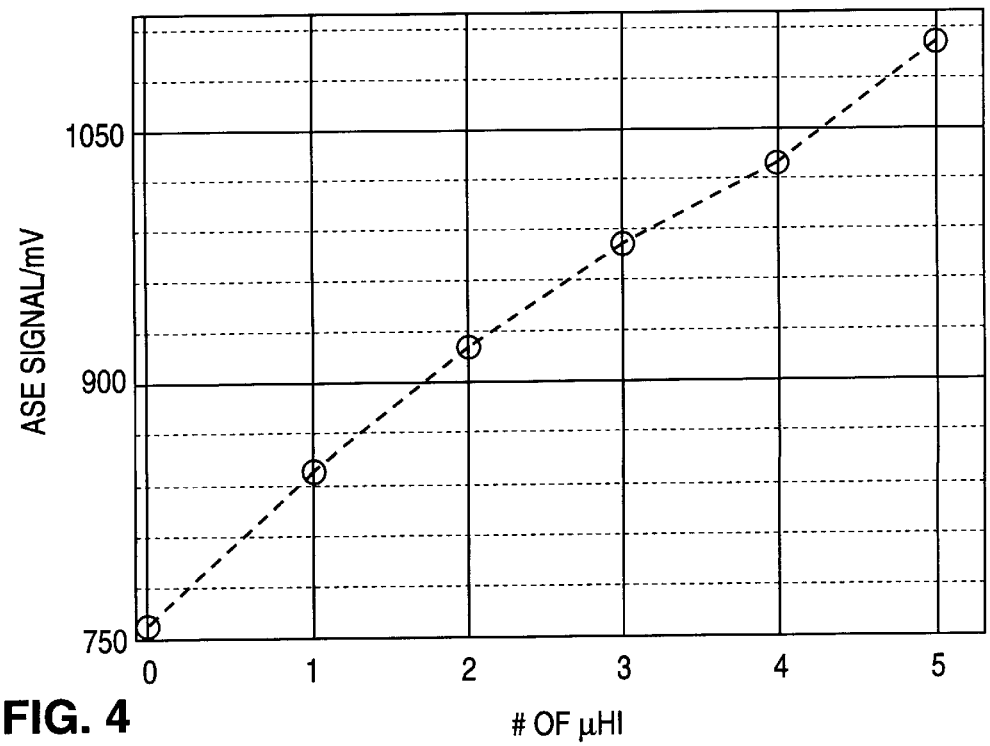
FIG. 4 is a graph of ASE signal versus number of halogen injections measured under constant driving voltage conditions.

FIG. 4 shows a measured ASE signal for a laser with a blocked resonator versus the halogen concentration at constant driving voltage. In the experiment shown at FIG. 4, a KrF laser with a blocked resonator was used. The halogen concentration of the $F_2$/Kr/Ne gas mixture was initially 0.1% (1% Kr, 98.9% Ne) and the measured ASE signal was about 750 mV. Then, the halogen concentration was increased using microhalogen injections ($\mu$Hls)such as are described in United States provisional patent application no. 60/124,785, which is hereby incorporated by reference into the present application. Each $\mu$/Hl resulted in an approximately 1.5% higher halogen concentration in the gas mixture. The ASE signal was shown in FIG. 4 to increase from around 750 mV to around 1100 mV after the fifth halogen injection.

FIG. 4 demonstrates the sensitivity of the ASE signal to small changes in the halogen concentration which usually occurs in excimer and molecular lasers such as KrF, ArF and $F_2$ lasers, as mentioned above. This sensitivity of the ASE signal to small changes in the halogen concentration also holds for a laser where the gain medium is within a resonator which is not blocked. Moreover, even in a laser operating in an energy-constant mode where the driving voltage is not constant but adjusted within a certain band to maintain the energy at a constant value, the ASE signal is strongly correlated to the gas mixture status. Therefore, continuous online control of the status of the gas mixture is possible without blocking the resonator and without interrupting industrial laser processing.

Figure 5:
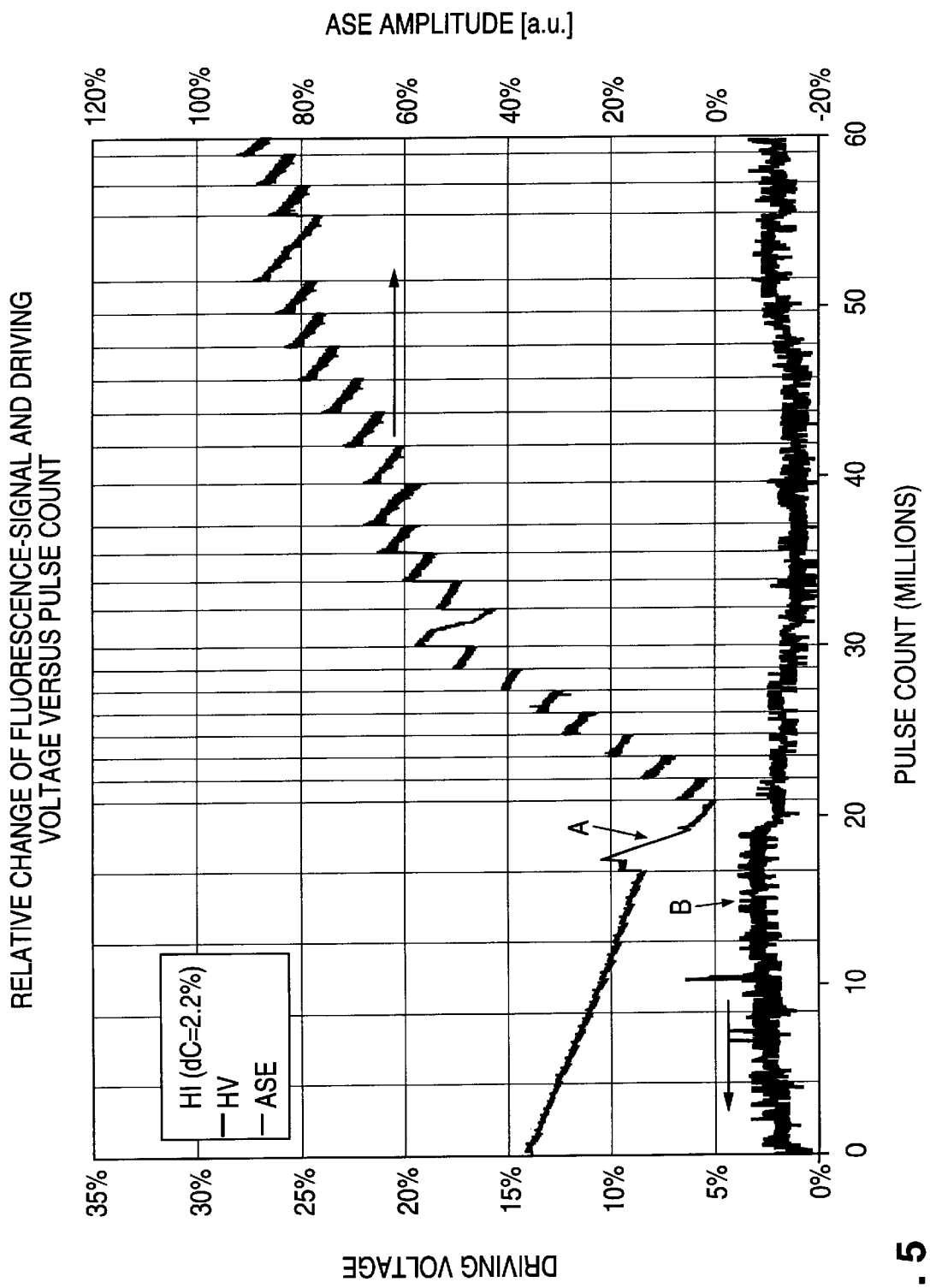
FIG. 5 shows a first graph of driving voltage versus pulse count and a second overlayed graph of ASE amplitude versus pulse count measured for a laser system wherein a series of halogen injections were performed each to increase the halogen concentration by 2.2% of its value at various shot intervals from 1.5 to 4 million shots over a range of 60 million shots following a new fill.

FIG. 5 shows two plots. Plot A is ASE signal amplitude versus pulse count. Plot B is driving voltage versus pulse count. The laser used for generating the data of FIG. 5 was operating at a repetition rate of 2 kHz in constant energy mode. Halogen injections were performed at each vertical line in the graph. As can be observed, the pulse count intervals between halogen injections were varied between about 1.5 and 4 million pulses. Although in a preferred embodiment of the present invention, a gas mixture regulation loop based on the measured ASE signal is used, such a regulation loop was not used when the data used in FIG. 5 were measured. Each halogen injection resulted in a 2.2% increase in the partial pressure of the halogen containing molecular species in the gas mixture.

As is clearly observed from a comparison of plot A and plot B in FIG. 5, the relative change in ASE signal is much larger than the change in driving voltage as a result of the gas actions. This shows a clear advantage in sensitivity of the present invention over conventional systems which monitor changes in driving voltage to track the gas mixture status. Both a sharp rise in ASE signal due to the halogen injections and a decrease in ASE signal between halogen injections are clearly resolved in plot A. In contrast, it is difficult to resolve any changes in driving voltage resulting from the halogen injections in plot B. The first three halogen injections have no effect on the ASE signal. This could be due to residual buffer gases remaining in the gas supply lines following the last new fill prior to the injections of FIG. 5 being performed. After around 20 million pulses, the rate of the halogen injections was increased from around once every 4 million pulses to about one every 1.5 million pulses. Though the starting ASE level was exceeded at the end of the experiment by about 50%, one skilled in the art would understand that the ASE signal level could be kept constant by appropriate adjustment of the Hl rate. In the present invention, such adjustments would be based on using the measured ASE signal as an input to a gas regulation loop.

A brief explanation is now provided for the enhanced sensitivity of the ASE signal to changes in gas mixture composition, most notably halogen concentration. The small-signal gain $g_0$ is proportional to the deposited power density ($U \bullet l$), where U is the steady state voltage and l is the discharge current. The steady state voltage U is a characteristic quantity of a gas discharge. For a fixed total pressure of the gas in an excimer laser such as a KrF or ArF laser, U depends largely on the ratio of the concentrations of the halogen and rare gases, i.e., c[halogen]/c[rare gas], where "c" represents "concentration". The rare gas concentration in the discharge chamber decreases very slowly over the lifetime of the laser gas, while the halogen concentration decreases faster due to chemical reactions. The time dependence of the discharge current l(t), or in other words, the power deposition (U×l(t), where U is nearly time independent during the steady discharge state) into the plasma depends on the characteristics of the external discharge circuit (i.e., the charging voltage $U_c$, the capacitance $C_p$ of the peaking capacitors connected in parallel to the electrodes, and the inductance L) and on the discharge resistance R which is U/l(t). The halogen concentration influences the whole time behavior of the small-signal gain and consequently the time behavior of the laser output. This qualitative analysis is modeled on a base of rate equations describing the time evolution of inversion density, laser photon density and ASE photon density.

FIGS. 6a–6b and FIGS. 7a–7b show the calculated laser pulses and the ASE pulses for two different halogen concentrations of a laser operating in constant energy mode (and thus operating at two different discharge voltages $U_0$ and $U_1$), using the parameters set forth in Table 1. In constant energy mode, the same number of laser photons are emitted in each pulse.

Figure 6A:
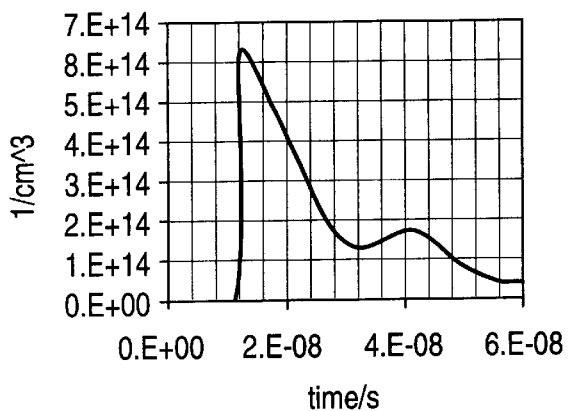
FIG. 6a is a graph of photon density versus time of a laser pulse calculated for an excimer or molecular laser system.
Figure 7A:
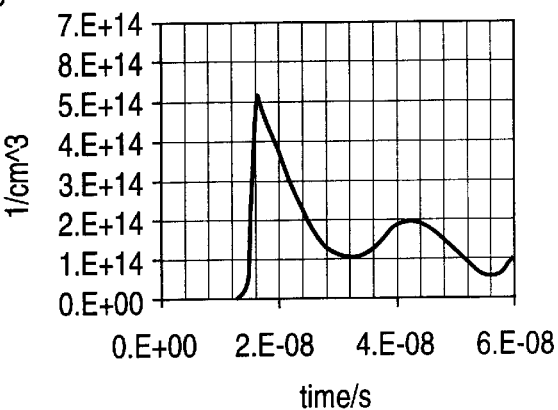
FIG. 7a is a graph of photon density versus time of a laser pulse calculated for the same laser system used in FIG. 6a having a lower halogen concentration and correspondingly higher driving voltage.
Figure 6B:
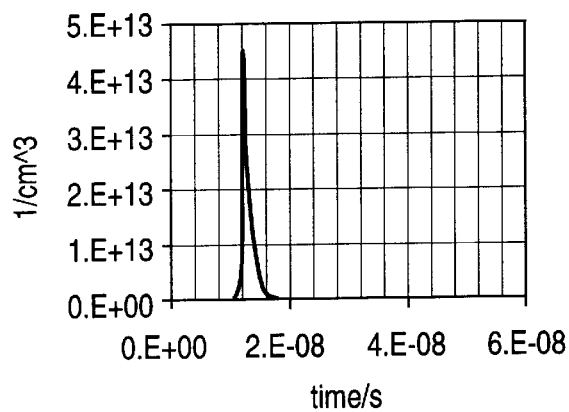
Figure 7B:
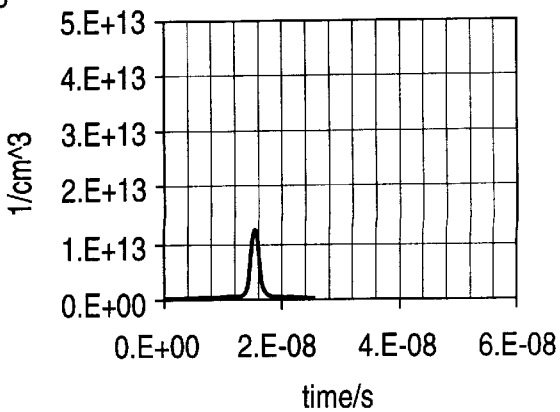

FIGS. 6a–6b show the photon density of the laser pulse and the ASE signal versus time, respectively, in the higher halogen concentration case. FIGS. 7a–7b, show the photon density of the laser pulse and the ASE signal versus time, respectively, in the lower halogen concentration case. In the lower halogen concentration case, the same number of laser photons are emitted as in the higher halogen concentration case (i.e., in constant energy mode), but in a longer pulse. That is, the area under the curves in FIGS. 6a and 7a is equal, even though there is a greater contribution from photons arriving at later times in the curve of FIG. 7a than in FIG. 6a. Specifically, the first peak in FIG. 7a, of two identifiable peaks observed in each of FIGS. 6a and 7a, is shorter and the second peak is taller as compared with those of FIG. 6a. Since we know the ASE signal is almost totally represented at the leading edge of the pulse (see discussion of the third embodiment or the references cited above), we expect the ASE signal contribution to be smaller in FIG. 7a and 7b than in FIGS. 6a and 6b.

In fact, the ASE signal is much smaller in the lower halogen concentration case of FIG. 7b than in the higher halogen concentration case of FIG. 6b. This is easily observed from the fact that the ASE peak is simply smaller in FIG. 7b than it is in FIG. 6b. Thus lower halogen concentrations produce longer laser pulses and smaller ASE signals. The parameters used in the calculations of FIGS. 6a–6b and 7a–7b are listed in Table 1.

TABLE 1

Parameters used in the Calculation of FIGS. 6a–6b and 7a–7b

| ITEMS | |
|---|---|
| stim. emission cross section/cm² (KrF) | $2.4 * 10^{-16}$ |
| lifetime of laser photons in the cavity | 3 ... 5 roundtrips |
| lifetime of ASE photons in the cavity | ½ ... ¾ roundtrips |
| lifetime of the upper laser state/ns | ≈7 |
| peaking capacity/nF | 6 |
| inductivity of the discharge circuit/nH (estimated by current measurements) | 4 ... 5 |
| pump rate factor/cm⁻³ s⁻¹ | $1*10^{23}$ |
| steady state voltage $U_0$/kV | ≈6 |
| fraction of spontaneous emission for laser photon amplification | $\approx 10^{-6} \ldots 10^{-5}$ |
| fraction of spontaneous emission for ASE photon amplification | $\approx 10^{-3}$ |

Figure 8:
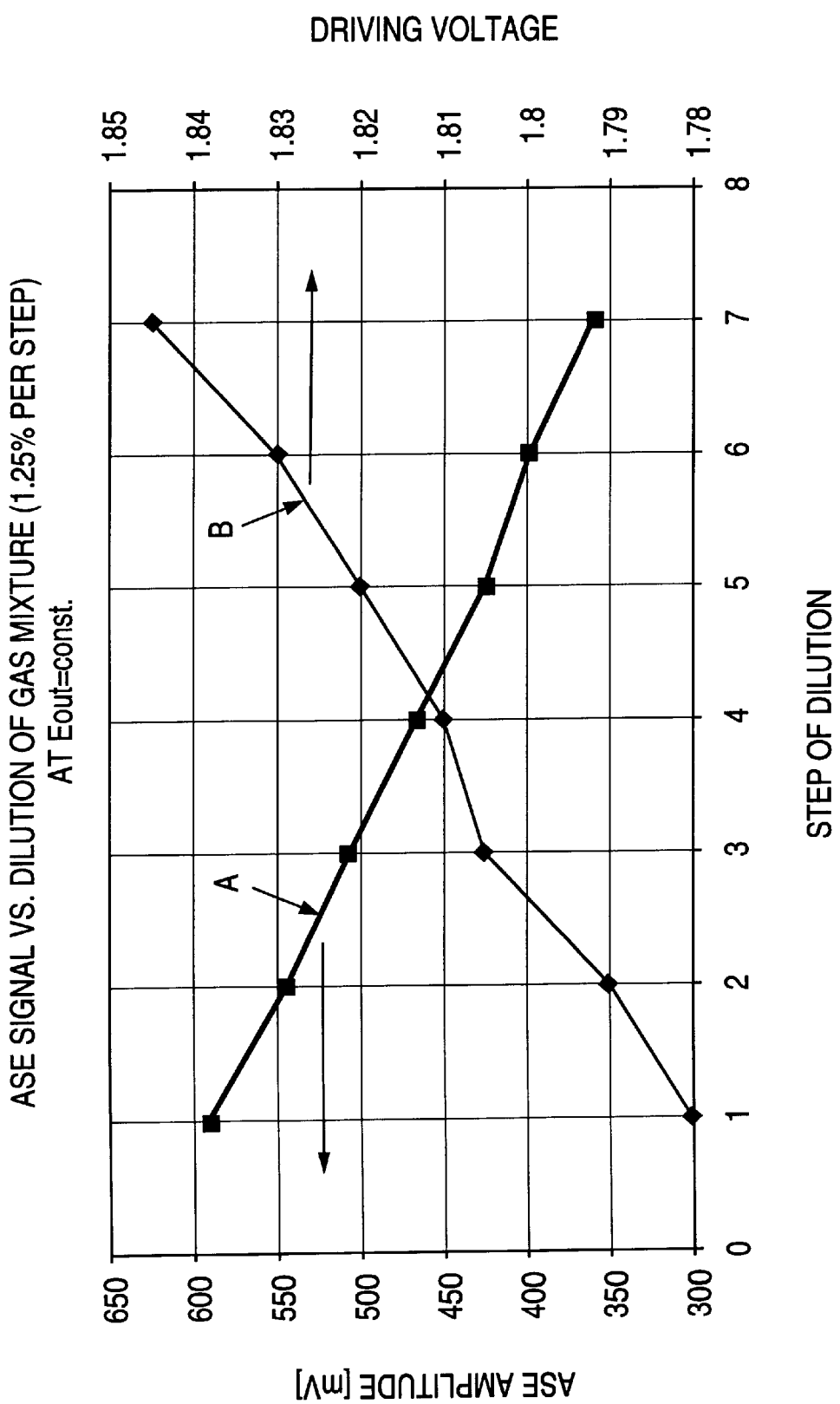
FIG. 8 shows a first graph of ASE signal versus number of 1.25% $F_2$ dilution steps, and a second overlayed graph of driving voltage versus number of 1.25% $F_2$ dilution steps, each measured for a KrF laser system.

FIG. 8 shows an experimentally measured graph of ASE signal versus halogen concentration in plot A, and driving voltage versus halogen concentration in plot B. In the experiment, the composition of the gas mixture was initially $F_2$:Kr:Ne=0.075%:1%:98.925%, and the halogen concentration was decreased incrementally in steps of 1.25%/step. The halogen depletion was realized by replacing portions of the gas mixture with the same amount of Ne/Kr (99% Ne, 1% Kr) resulting in the 1.25% dilution of only $F_2$ per step. The ASE signal was separated for detection using the apparatus shown in FIG. 2a described above. The ASE signal is observed in plot A to decrease by about 40 mV per step, while the driving voltage is increased by about 0.01 kV per step to maintain constant output energy of the laser pulses.

The ASE signal in FIG. 8 is again observed to be very sensitive to slight changes in the halogen concentration. The signal becomes significantly smaller when the halogen is removed, even though the driving voltage is increased to keep the laser pulse energy constant.

In accord with the present invention, the sensitivity of the ASE signal to slight changes in the status of the gas mixture, especially the halogen content, is used advantageously as an input signal for a gas performance control system. The following applications of ASE controlled laser regulation may be used in accord with the present invention. First, ASE control may be used with smoothed long-term stabilization of the laser gas by micro halogen injections ($\mu$Hls) as described in the 60/124,7850 provisional patent application incorporated by reference above. A typical approach might be to maintain the ASE signal S at a constant level or within a certain narrow range, e.g., $S-\Delta S<S<S+\Delta S$, using $\mu$Hls or other smoothed gas actions wherein one or more gas components are replenished by injection or mini gas replacement MGR or partial gas replacement PGR.

Second, a second parameter such as the driving voltage (HV) could be used as an additional input for a Hl regulation loop. This is clear from an inspection of plot B in FIG. 8. While the ASE signal is directly correlated with the gas mixture status, in our example particularly with halogen concentration, the HV is influenced by other parameters like resonator alignment or degradation of resonator optics. In this way, the correspondence between the ASE signal and the HV signal indicates problems arising within the resonator. For example, if the ASE signal is held constant by maintaining a constant halogen concentration, but HV is nonetheless increased to achieve constant laser pulse energy, an indication of either resonator optics degradation or resonator misalignment is realized. In this scenario, when the ASE signal and HV information indicate such a problem with the resonator, an error signal or warning message could be triggered by laser control software. Examples of some of the system specifications that could be indirectly monitored by directly monitoring the second parameter, e.g., driving voltage, in addition to monitoring the ASE signal to monitor gas mixture status are alignment of an optical component, degradation of an optical component, synchronization of two or more optical components such as two reflective elements, one or both being a resonator reflector, or two or more prisms, or one or more prism(s) and either a grating or HR mirror, etc., contamination within the resonator such as ozone or oxygen especially along the beam path or dust especially on the optics or on a tube window, or an insufficiently clean beam path or purge strength especially for the $F_2$ laser, but also potentially for the ArF-laser, since the $F_2$-laser requires a beam path free of photoabsorbing species such as water, oxygen and/or hydrocarbons, and is preferably operated having a purging inert gas flowing within a beam path enclosure (see U.S. provisional patent application no. 60/119,973, which assigned to the same assignee and is hereby incorporated by reference into the present application).

Third, the ASE signal S may be used to control a new fill procedure. Halogen concentration can vary from gas supply bottle to gas supply bottle and can also be influenced by long gas lines. The ASE signal S can be used for fine tuning of the total gas replenishment performed in a new fill procedure. A typical procedure of such a "self-calibrating" new fill might be to fill the laser with laser active gases, e.g., halogen and rare gases in an excimer laser or $F_2$ in an $F_2$ molecular laser, to a concentration that is somewhat less than the expected concentrations fixed in the laser settings. The result would be a lower ASE signal than is expected from a laser after a new fill with the expected concentrations, e.g., $S<S_{expected}$. There would follow smoothed gas injections such as $\mu$Hls until $S=S_{expected}$ is achieved.

The specific embodiments described in the specification, drawings, summary of the invention and abstract of the disclosure are not intended to limit the scope of any of the claims, but are only meant to provide illustrative examples of the invention to which the claims are drawn. The scope of the present invention is understood to be encompassed by the language of the claims, and structural and functional equivalents thereof.

What is claimed is:

1. An excimer or molecular fluorine laser system which emits a laser beam during operation and has a gas mixture with a gas composition initially provided within a discharge chamber comprising:

a discharge chamber containing a gas mixture;

a pair of electrodes connected to a power supply circuit for energizing the gas mixture;

a resonator for generating a laser beam a gas control unit for replenishing the laser gas mixture; and amplified spontaneous emission monitoring means for monitoring an amplified spontaneous emission (ASE) signal of the laser, wherein the monitoring means signals the gas control unit to initiate a gas replenishment operation to bring a composition of the laser gas mixture within the discharge chamber closer to the initially provided composition, and wherein said monitoring means signals said gas control unit to initiate said gas replenishment operation when the monitoring means determines that a composition of the laser gas mixture is deviated a predetermined amount from the initially provided composition based on the monitored amplified spontaneous emission monitored by the monitoring means.

2. The laser system of claim 1, wherein said ASE signal monitoring means is an ASE detector.

3. The laser system of claim 1, wherein said ASE signal monitoring means detects primarily said ASE signal substantially independent of stimulated emission signal of the laser.

4. The laser system of claim 3, further comprising means for substantially filtering the stimulated emission from a portion of the laser beam to permit the ASE signal to be monitored separate from the stimulated emission signal.

5. The laser system of claim 4, wherein said stimulated emission filtering means includes a central axis beam dump centrally positioned with the optical axis of said portion of the laser beam, wherein the dimensions of the beam dump are set such that the stimulated emission is substantially blocked and mostly ASE radiation passes unblocked around the beam dump.

6. The laser system of claim 4, wherein said stimulated emission filtering means includes filtering out a polarization component of said portion of the laser beam corresponding to the stimulated emission.

7. The laser system of claim 4, wherein said stimulated emission filtering means includes temporally filtering out all but the very leading edge of the laser pulse, said leading edge containing the ASE signal, while all but the leading edge is substantially the stimulated emission.

8. The laser system of claim 4, further comprising a movable shutter for selectable insertion into the beam path to prevent laser action.

9. An excimer or molecular fluorine laser system which emits a laser beam during operation and has a gas mixture with a gas composition initially provided within a discharge chamber, comprising:
a discharge chamber containing a gas mixture;
a pair of electrodes connected to a power supply circuit for energizing the gas mixture;
a resonator for generating a laser beam
a gas control unit for replenishing the laser gas mixture; and
an amplified spontaneous emission (ASE) detector and a processor for monitoring an ASE signal emanating from the laser chamber,
wherein the processor signals the gas control unit to initiate a gas replenishment operation to bring a composition of the laser gas mixture within the discharge chamber closer to the initially provided composition, and
wherein said processor signals said gas control unit to initiate said gas replenishment operation when the processor determines that a composition of the laser gas mixture is deviated a predetermined amount from the initially provided composition based on the monitored amplified spontaneous emission monitored by the ASE detector and processor.

10. The laser system of claim 9, wherein said ASE detector detects said ASE signal substantially separate from any stimulated emission signal of the laser.

11. The laser system of claim 10, further comprising a stimulated emission filter for filtering the stimulated emission from a portion of the laser beam to permit the ASE signal to be monitored substantially separate from any stimulated emission signal.

12. The laser system of claim 11, wherein said stimulated emission filter includes a central axis beam dump centrally positioned with the optical axis of said portion of the laser beam, wherein the dimensions of the beam dump are set such that the stimulated emission is substantially blocked and mostly ASE radiation passes unblocked around the beam dump.

13. The laser system of claim 11, wherein said stimulated emission filter includes means for filtering out a polarization component of said portion of the laser beam corresponding to the stimulated emission.

14. The laser system of claim 11, wherein said stimulated emission filter includes means for temporally filtering out all but the very leading edge of the laser pulse, said leading edge containing the ASE signal, while all but the leading edge is substantially the stimulated emission.

15. The laser system of claim 11, wherein feedback from said resonator is blocked to reduce stimulated emission and facilitate detection of said ASE signal.

16. A gas discharge excimer or molecular fluorine laser system, comprising:
a discharge chamber containing a gas mixture including a halogen containing species which is subject to depletion;
a pair of electrodes connected to a power supply circuit for energizing the gas mixture;
a resonator for generating a laser beam; and
means for monitoring two laser system parameters including a first parameter indicative of the status of the gas mixture and a second parameter indicative of the status of another laser system specification which is independent of the status of the gas mixture,
wherein said system specification is selected from the group of system specifications consisting of alignment of an optical component, degradation of an optical component, synchronization of two or more optical components, contamination within the resonator, and purge conditions for one of an ArF-laser enclosure and a $F_2$-laser enclosure.

17. The laser system of claim 16, wherein said system specification is alignment of an optical component.

18. The laser system of claim 17, wherein said optical component is a resonator reflector.

19. The laser system of claim 17, wherein said optical component is a reflective grating.

20. The laser system of claim 16, wherein said system specification is degradation of an optical component.

21. The laser system of claim 1, wherein said system specification is synchronization of two or more optical components.

22. The laser system of claim 21, wherein one of said two or more optical components is a resonator reflector.

23. The laser system of claim 21, wherein one of said two or more optical components is a prism.

24. The laser system of claim 16, wherein said system specification is contamination with one or more of dust, ozone and oxygen within the resonator.

25. The laser system of any of claims 16–18, 20–21 or 24, wherein said first parameter is amplified spontaneous emission (ASE).

26. The laser system of claim 25, wherein said laser is one of an excimer laser and an $F_2$-laser.

27. The laser system of claim 25, wherein said second parameter is driving voltage.

28. The laser system of any of claims 16–18, 20–21 or 24, wherein said second parameter is driving voltage.

29. A method of stabilizing during operation a gas mixture initially provided within a discharge chamber of a gas discharge excimer or molecular laser with an initial composition, including a first constituent gas that is subject to depletion, comprising the steps of:
monitoring an amplified spontaneous emission (ASE) signal of the laser; and
adjusting the gas mixture based on the monitored ASE signal,
wherein said adjusting stop includes signaling a gas control unit to initiate a gas replenishment operation to bring a composition of the laser gas mixture within the discharge chamber closer to the initially provided gas composition, when the processor determines that a composition of the laser gas mixture is deviated a predetemined amount from the initially provided composition based on the monitored ASE signal measured by the detector.

30. The method of any of claims 29, further comprising the step of filtering stimulated emission from an outcoupled beam of said laser to permit the ASE signal to be monitored substantially separate from any stimulated emission signal.

31. The method of claim 30, wherein the filtering step includes the steps of positioning a beam dump substantially centrally with the optical axis of said outcoupled beam, and selecting dimensions of the beam dump such that stimulated emission is substantially blocked and mostly ASE radiation passes unblocked around the beam dump.

32. The method of claim 30, wherein the filtering step includes the step of filtering out a polarization component of the outcoupled beam corresponding to the stimulated emission.

33. The method of claim 30, wherein the filtering step includes the step of temporally filtering out all but the very leading edge of the laser pulse, said leading edge containing the ASE signal, while all but the leading edge is substantially the stimulated emission.

34. The method of any of claim 29, further comprising the step of blocking feedback from the resonator of the laser to reduce stimulated emission and facilitate monitoring of said ASE signal.

35. The method of any of claim 29, further comprising the step of selecting an ASE detector for monitoring said ASE signal.

36. The method of any of claim 29, further comprising the step of injecting a diluent mixture including said constituent gas at predetermined intervals into the discharge chamber to replenish the constituent gas.

37. The method of claim 36, wherein the injecting step includes the steps of selecting a halogen containing molecular species as said constituent gas and selecting an amount of said constituent gas included within said diluent mixture between 0.0001 mbar and 0.5 mbar.

38. The method of claim 36, further comprising the step of selecting said predetermined intervals to be changes in ASE signal.

39. The method of claim 38, further comprising the step of selecting said changes in ASE signal in a range between 0.1% and 20%.

40. The method of claim 36, further comprising the step of selecting said changes in ASE signal in a range between 0.1% and 10%.

41. The method of claim 36, further comprising the step of releasing some of the gas mixture from the discharge chamber.

42. The method of any of claim 29, further comprising the step of controlling the composition of gases of the gas mixture within the discharge chamber based on the monitored ASE signal.

43. The method of any of claim 29, further comprising the step of monitoring a driving voltage (HV) signal of the laser, wherein said determining step includes determining the status of another system specification independent of the gas mixture composition based on the monitored ASE and HV signals.

* * * * *